United States Patent [19]

Grabbe et al.

[11] Patent Number: 4,550,959
[45] Date of Patent: Nov. 5, 1985

[54] SURFACE MOUNTABLE COEFFICIENT OF EXPANSION MATCHING CONNECTOR

[75] Inventors: Dimitry G. Grabbe, Middletown; Iosif Korsunsky, Harrisburg, both of Pa.

[73] Assignee: AMP Incorporated, Harrisburg, Pa.

[21] Appl. No.: 673,222

[22] Filed: Nov. 20, 1984

Related U.S. Application Data

[63] Continuation of Ser. No. 484,651, Apr. 13, 1983, abandoned.

[51] Int. Cl.[4] ............... H05K 1/00; H01R 13/504; H01R 9/09
[52] U.S. Cl. .................. 339/9 E; 339/17 LM; 339/176 MP; 339/198 G; 29/843
[58] Field of Search ............ 339/9 E, 17 LC, 17 LM, 339/17 M, 176 MP, 198 G; 29/840, 842, 843

[56] References Cited

U.S. PATENT DOCUMENTS 3,795,884 3/1974 Kotaka ..................... 339/17 LM
4,275,944 6/1981 Sochor .................. 339/176 MP X

FOREIGN PATENT DOCUMENTS 0001477 6/1978 European Pat. Off. .
2730127 1/1978 Fed. Rep. of Germany .
1590423 7/1977 United Kingdom .

OTHER PUBLICATIONS

National Connector Corp. Publication, "Snap-Lok Card Receptacle", Jan., 1963.
IBM Technical Disclosure Bulletin, vol. 21, No. 3, Aug. 1978, Printed-Circuit Card to Cable Connection System, H. Pasterchick, Jr.

Primary Examiner—Gil Weidenfeld
Assistant Examiner—Steven C. Bishop
Attorney, Agent, or Firm—Donald M. Boles

[57] ABSTRACT

A modular connector housing of relatively short length and having a coupling feature, such as a tab at one end and a recess at the other end, is connected with other similar connector housings. A filler material having a melting point lower than that of the particular soldering method chosen is then inserted into that portion where two housings are joined thereby forming a relatively rigid long connector housing. A hot-melt adhesive preform is then placed on the bottom of the connector housing with the entire connector housing assembly aligned with and attached to a printed circuit board. The hot-melt adhesive bonds the connector housing to the substrate while the filler material melts away from the filler openings, allowing the short incremental housing lengths to move relatively free with respect to each other.

13 Claims, 4 Drawing Figures

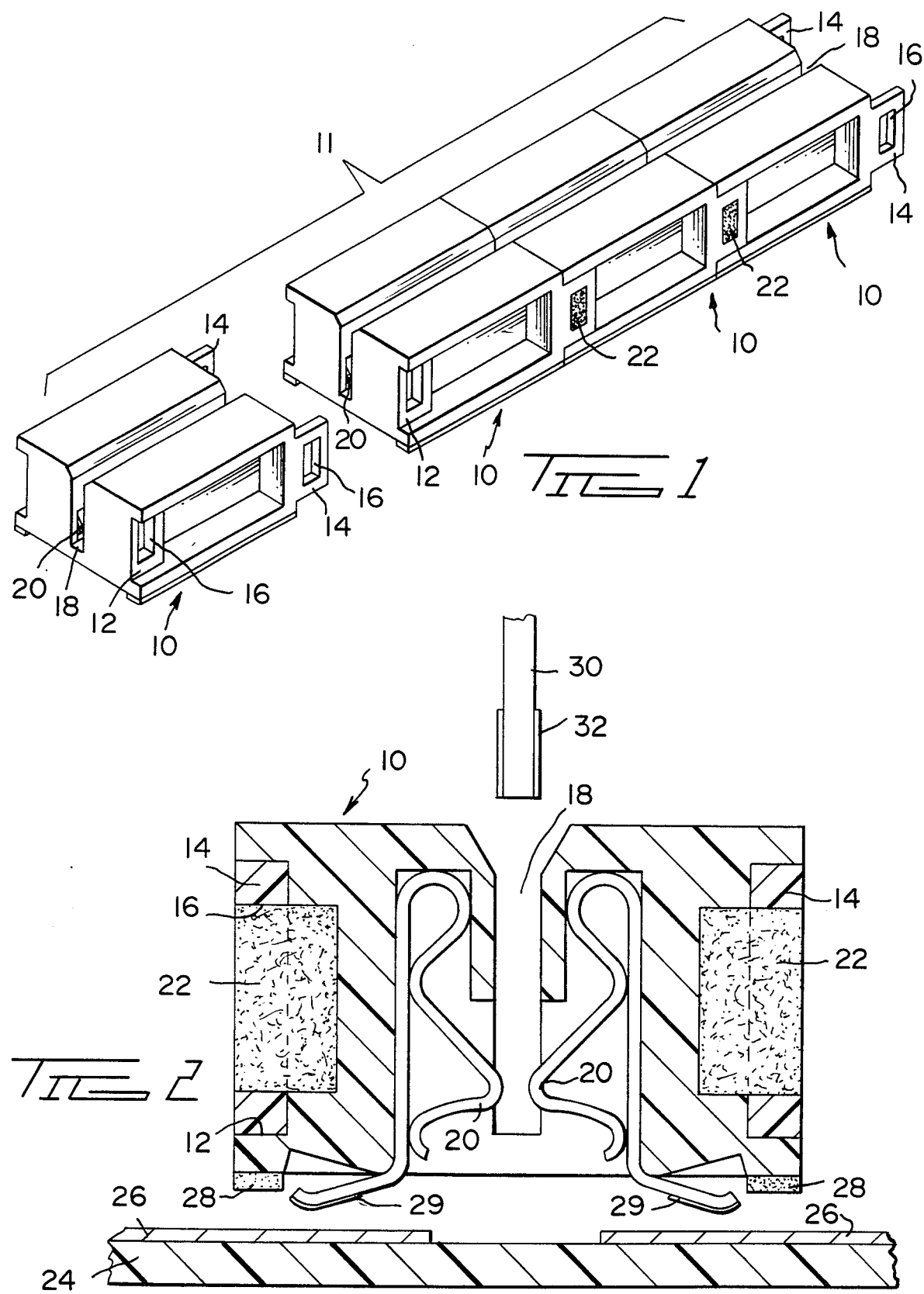

SURFACE MOUNTABLE COEFFICIENT OF EXPANSION MATCHING CONNECTOR

This application is a Continuation of application Ser. No. 484,541 filed 04/13/83, now abandoned.

BACKGROUND OF THE INVENTION

This invention relates, generally, to a long connector housing and more particularly to a modular connector housing which is comprised of a series of connector housings which have a space therebetween so as to minimize the mismatching of thermal coefficients of coexpansion between the connector housing and the surface upon which is mounted.

With the advent of higher and higher density integrated circuitry, the electrical interconnection scheme between adjacent components and/or circuit boards requires more and more dense or compact contact and housing structures. Additionally, the number of interconnecting conductors is correspondingly increased. This tends to present a problem in that long connectors having as many as 1,600 contacts may be utilized. Two examples of connectors which are utilizable in long housing lengths and therefore capable of holding a high number of contacts may be found in U.S. Pat. No. 4,203,203 "Electricl Connector And Method Of Manufacture" issued May 20, 1980 to Gilissen et al and U.S. Pat. No. 3,795,884 "Electrical Connector Formed From Coil Spring" issued Mar. 5, 1974 to Kotaka. When installing such connectors having that many contacts, temperature changes which may result during soldering and field operations, may bring about coefficient of expansion mismatch problems in that the coefficient of expansion between the connector housing and the surface upon which it is mounted are different. Even in those situations where a deliberate attempt is made to minimize such mismatch, the very fact that two separate and distinct components are utilized may result in a mismatch. Therefore, contact misalignment, board or housing warpage and in some cases damage to contacts in a housing may result. This problem is particularly prevalent when surface mounting instead of hole mounting must be utilized.

It is desirable to have a device which allows for overall long housing lengths having a large number of contacts and which minimizes coexpansion mismatches even under worse case conditions. Further, it is desirable to have a device which is relatively simple to manufacture and assemble as well as being relatively inexpensive. Such a device is taught by the present invention.

Accordingly, the present invention teaches and as an object of the present invention an electrical connector housing for matching relatively the expansion or contraction of the connector housing relative to the expansion or contraction of a connector housing relative to the expansion or contraction of the substrate upon which it is mounted, comprising at least two connector housings having electrical contacts contained therein, the modular housings disposed on a substrate or the like, a filler material inserted in an opening in the housings at that point wherein the housings are joined so as to secure the housings to each other thereby forming a relatively rigid connector housing assemblage, the filler material being removed at a point in time after the assemblage is fixedly attached to a substrate thereby allowing the connector housings to move independently with respect to each other and the substrate in response to contraction or expansion of the substrate material or the housing.

BRIEF DESCRIPTION OF THE DRAWINGS

Reference is now made to the description of the preferred embodiment illustrated in the accompanying drawings in which:

FIG. 1 is an isometric view of the modular housing of the present invention;

FIG. 2 is a cross-sectional elevational view taken through one of the housings of FIG. 1 prior to attachment to a printed circuit board;

DESCRIPTION OF THE PREFERRED EMBODIMENT

Figure 4:
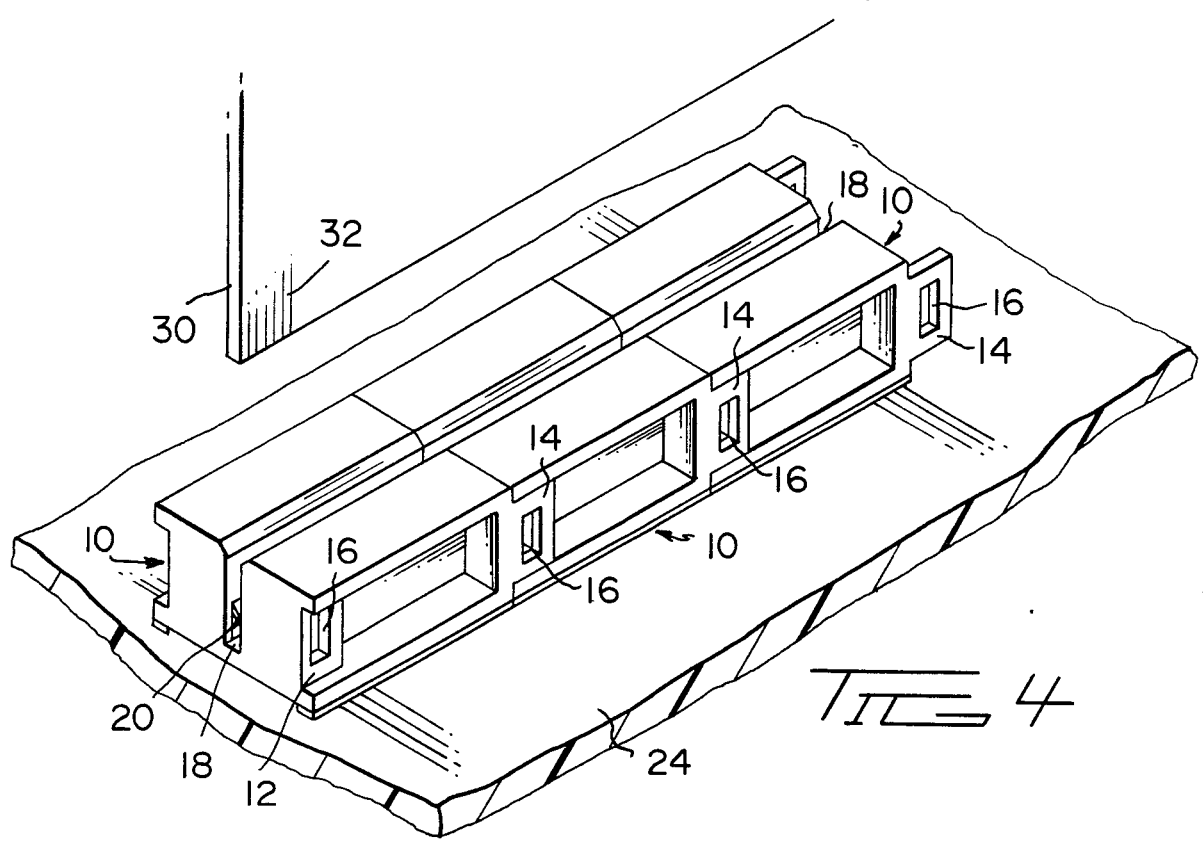
FIG. 4 is an isometric view of the connector housing of the present invention attached to a printed circuit board ready to be mated with a second printed circuit board.

Referring now to FIG. 1 there is shown an isometric view of the housings of the present invention. Here it can be seen how the connector housing shown generally at 10 is joined with other housings 10 so as to form a long connector or assemblage 11. The modular connector housing 10 has a housing tab recess 12 at one end and a tab 14 at the other end. Disposed in the housing tab recess 12 and the tab 14 are filler openings 16 which are filled with a filler material 22 (shown more clearly in FIGS. 2 and 3). A slot 18 is provided for the insertion of a daughter board 30 (shown in FIG. 4). Contacts 20 are disposed in the slot 18 (shown more clearly in FIGS. 2 and 3). The connector housings 10 are interconnected by use of the housing tab recess and the tab 12, 14 respectively, thereby forming an interlocking relationship so as to form a long connector 11.

Referring now to FIG. 2, there is shown a cross-sectional elevational view taken through connector housing 10. Here it can be seen that a daughter board 30, which in the preferred embodiment of the present invention is a printed circuit board, having daughter board conductive strips 32 contained thereon would be inserted into the slot 18 so as to allow the conductive strips 32 to make electrical contact with the contacts 20 thereby providing electrical communication therebetween. Shown also is how the housing tab or recesses 12 mate with the tabs 14. This therefore allows a housing interdigitation so as to provide a long connector 11. Upon mating of connector housings 10, a meltable filler material 22, such as, for example, wax is inserted or injected into the filler opening 16. Therefore this relatively rigidly holds the connector housings 10 together with all cavities correctly spaced which are then capable of being packaged for later installation onto a circuit board. Further, this also provides a rigid, relatively stiff long connector 11 assembly, having proper contact to contact spacing. It used to be understood, however, that plastic or plastic pins may also be utilized as long as the temperature at which the filler material 22 melts, is below that of the solder which may be used (shown in FIG. 3). Disposed on the connector housing 10 is an adhesive 28, such as, for example, a family of cyano acrilates or hot-melt adhesives manufactured by the 3M Corporation of St. Paul, Minn. 55101. The hot-melt adhesive facilitates proper alignment between the connector 10 having contacts 20 contained therein and the conductive strips 26 contained on the mother board 24 during any intermediate manufacturing or processing steps.

Figure 3:
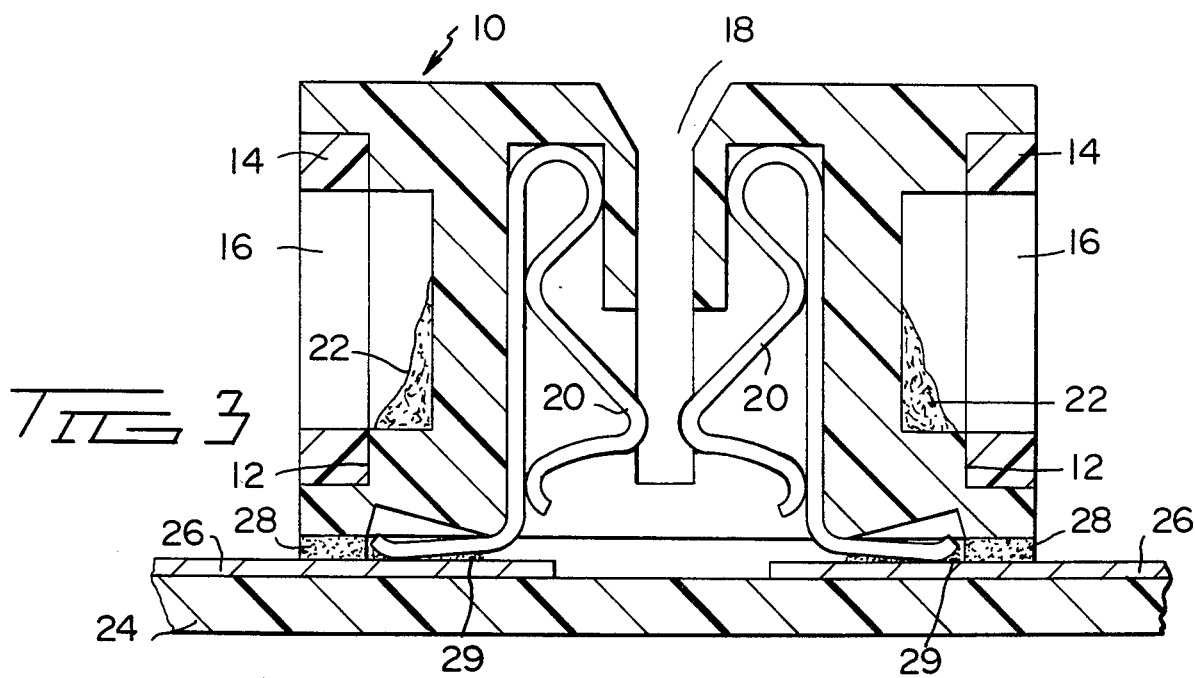
FIG. 3 is a cross-sectional elevational view similar to that of FIG. 2 after attachment to a printed circuit board.

Referring now to FIG. 3, there is shown a cross-sectioned elevational view similar to that of FIG. 2 with the connector housing 10 mounted on the mother board 24. Here it can be seen how the lower portion of the contact 20 has receded so as to be coplanar with the conductive strips 26 and how the solder 29 has joined the lower portion of the contact 20 to the conductive strip 26. In the preferred embodiment of the present invention solder 29 is applied by a reflow solder technique, however it is to be understood that other types of soldering may be utilized. Since the temperature of the solder 29 is above the melting temperature of the filler material 22, the filler material, shown only partially removed for illustration purposes, would generally completely flow out of or evaporate from the filler opening 16 thereby allowing the housing tab recess 12 to be separable from the tab 14. This allows housing 10 to housing 10 movement in the long connector assemby 11. Additionally, the adhesive 28 during the soldering operation seals and bonds the connector housing to the substrate. Upon cooling of the entire assembly, a structure is therefore obtained in which each segment of the connector housing 10 is now free to move at an apparent coefficient of expansion essentially totally controlled by the properties of the substrate material, in this case the mother board 24. The coexpansion mismatches therefore under such short distances, from housing 10 to housing 10 are acceptable even under worse case conditions.

Referring now to FIG. 4, there is shown a isometric view of the long connector assembly 11 of the present invention in use with a mother board 24 and a daughter board 30 as a card edge type system. Here it can be seen how movement from housing 10 to housing 10 due to coefficient of expansion mismatching would result in very small displacement. This is as opposed to a singular housing which would dictate that the coefficient of expansion mismatch for the entire connector be accumulated over the total length of the connector. This would mean that a significant and appreciable deformation may take place from one end of the connector housing to the far end of the connector housing much the same way a thermostatic bimetal pair would act.

It is to be understood that many variations of the present invention may be utilized without departing from the spirit and scope of the present invention. For example, differing shapes of connector housings such as square may be utilized while a different housing structure entirely may be envisaged such as, for example, a chip carrier housing whereby each side of the housing or housing segment is joined in this manner or even having each side of the chip carrier housing comprised of more than one segment. Further, the filler material may be of a non-meltable type such as, for example, pins which would be removed after the soldering process. Also, the adhesive may be eliminated with other aligning methods such as pins or recesses utilized. Different types of material for the housing and printed circuit boards may also be utilized while the connector may utilize contacts designed to have posts which extend through the printed circuit board. Additionally, different recess, tab, and filler opening arrangements may be utilized such as, for example, allowing a housing to be inserted from the top of an adjacent housing or a different type of substrate other than a printed circuit board may be used.

Therefore, in addition to the above-enumerated advantages the disclosed invention produces an interdigitated connector housing structures and methods which are joinable to form exceedingly long connector housing lengths. Also the coefficient of coexpansion mismatches between the housing and the carrier upon which it is mounted are held to acceptable levels even under worse case conditions. Further the disclosed invention is suitable for a multitude of uses such as chip carriers and/or card edge connectors which are relatively inexpensive as well as easy to manufacture, and which are also relatively easy to utilize in the field applicable in a large multitude of situations.

We claim:

1. An electrical connector housing for moving relatively with the expansion or contraction of the substrate upon which it is mounted, comprising:
   at least two modular connector housing means having electrical contacts contained therein, said housing means joined to each other at one end thereof, and being disposed on a substrate or the like;
   meltable filler material means inserted in an opening where said housing means are joined so as to secure said housing means to each other thereby forming a connector housing assemblage, characterized in that said meltable filler material means is meltable at a temperature substantially less than that of the modular connector housing means.

2. A device according to claim 1 wherein said meltable filler material means is comprised of wax or the like.

3. A device according to claim 1 wherein said electrical contacts are soldered to said substrate.

4. A device according to claim 3 wherein said meltable filler material means is comprised of a material having a melting point lower than that of said solder, such that said filler material means melts during said soldering.

5. A device according to claim 4 wherein said meltable filler material means is comprised of wax or the like.

6. A device according to claim 4 wherein said meltable filler material means is plastic.

7. A device according to claim 1 wherein said substrate is comprised of a printed circuit board having conductive strips contained thereon.

8. A method of attaching a plurality of electrical connector housings to a substrate or the like for moving relatively with the expansion or contraction of the substrate upon which it is mounted, comprising the steps of:
   a. joining at least two modular connector housings together, said housings having electrical contacts contained therein;
   b. applying a meltable filler material at the point wherein said housings are joined so as to secure the housings together thereby forming a relatively rigid connector housing assemblage;
   c. mounting said assemblage on a printed circuit board or the like;
   d. soldering said contacts contained in said connector housings to conductive strips contained on said printed circuit board at a temperature sufficiently high so as to properly solder said contacts to said printed circuit board and to melt said filler material thereby allowing said connector housings to move relatively independently with respect to each other.

9. A method of attaching a plurality of electrical connector housings to a substrate or the like for moving relatively with the expansion or contraction of the substrate upon which it is mounted, comprising the steps of:
 a. joining at least two modular connector housings together, said housings having electrical contacts contained therein;
 b. applying a filler material at the point wherein said connector housings are joined so as to secure the connector housings together thereby forming a relatively rigid connector housing assemblage;
 c. mounting said assemblage on a printed circuit board or the like;
 d. soldering said contacts contained in said connector housings to conductive strips contained on said printed circuit board; and
 e. removing said filter material from said connector housings thereby allowing said connector housings to move relatively independently with respect to each other.

10. An electrical connector for moving relatively with the expansion or contraction of the substrate upon which it is mounted, comprising:
 a connector housing which is formed from a plurality of modular segments;
 electrical contacts contained in each of said modular segments;
 meltable filler material means inserted in an opening in said modular segments at that point wherein said modular segments are joined to each other so as to form a connector housing assemblage, characterized in that said meltable filler material means is meltable at a temperature substantially less than that of the modular connector housing means and said electrical contacts.

11. A device according to claim 10 wherein said meltable filler material means is wax or the like.

12. A device according to claim 10 wherein said electrical contacts are soldered to a conductive strip contained on said substrate.

13. A device according to claim 12 wherein said meltable filler means melts at a temperature less than the temperature obtained during said soldering such that said filler material means is melted away during said soldering.

* * * * *